(12) United States Patent
Goruganthu et al.

(10) Patent No.: US 6,891,390 B1
(45) Date of Patent: May 10, 2005

(54) CIRCUIT ANALYSIS USING ELECTRIC FIELD-INDUCED EFFECTS

(75) Inventors: Rama R. Goruganthu, Austin, TX (US); Michael R. Bruce, Austin, TX (US)

(73) Assignee: Advanced Micro Devices, Sunnyvale, CA (US)

( * ) Notice: Subject to any disclaimer, the term of this patent is extended or adjusted under 35 U.S.C. 154(b) by 109 days.

(21) Appl. No.: 10/086,505

(22) Filed: Feb. 28, 2002

(51) Int. Cl.[7] ............................................. G01R 31/26
(52) U.S. Cl. ..................................................... 324/765
(58) Field of Search ................................. 438/5, 10, 11, 438/12, 14, 17, 18; 324/765, 750; 73/104, 105; 250/306

(56) References Cited

U.S. PATENT DOCUMENTS

| | | | | |
|---|---|---|---|---|
| 5,493,236 A | * | 2/1996 | Ishii et al. ................... | 324/752 |
| 5,517,128 A | * | 5/1996 | Henninger ................... | 324/765 |
| 6,331,782 B1 | * | 12/2001 | White et al. ................. | 324/763 |
| 6,412,086 B1 | * | 6/2002 | Friedman et al. ............ | 714/733 |
| 6,417,680 B1 | * | 7/2002 | Birdsley et al. ............. | 324/752 |
| 6,448,096 B1 | * | 9/2002 | Birdsley et al. ............. | 438/14 |
| 6,686,755 B2 | * | 2/2004 | White et al. ................. | 324/763 |

* cited by examiner

*Primary Examiner*—Evan Pert
*Assistant Examiner*—Scott B. Geyer

(57) ABSTRACT

Circuitry within a semiconductor die is analyzed by applying an electric field without necessarily directly accessing the circuitry. According to an example embodiment of the present invention, an electric field is applied to a semiconductor die and used to stimulate circuitry therein. A response of the die to the electric field is detected and used to detect an electrical characteristic of the die. This is particularly useful in applications where it is desired to direct stimulation to the die on a nanoscale level, such as when using a fine probe tip (e.g., a scanning probe microscope tip) to apply the electric field. In this manner, the response of the die can be mapped to circuitry within a few nanometers of the probe tip.

21 Claims, 3 Drawing Sheets

CIRCUIT ANALYSIS USING ELECTRIC FIELD-INDUCED EFFECTS

FIELD OF THE INVENTION

The present invention relates generally to semiconductor devices and their fabrication and, more particularly, to testing and defect analysis of semiconductor dies.

BACKGROUND OF THE INVENTION

Recent technological advances in the semiconductor industry have permitted highly functional, high-density circuit arrangements for integrated circuits, microprocessors and other semiconductor device applications. A by-product of such high functionality and high density is an increased demand for products employing these devices for use in numerous applications. As the use of these devices has become more prevalent, the demand for faster operation and better reliability of the devices has also increased. In addition, such devices often require manufacturing processes that are highly complex and expensive.

As the manufacturing processes for semiconductor devices and integrated circuits increase in difficulty, methods for testing and debugging these devices become increasingly important. Not only is it important to ensure that individual dies are functional, it is also important to ensure that batches of dies perform consistently. In addition, the ability to detect a defective manufacturing process early is helpful for reducing the number of defective devices manufactured.

Traditionally, integrated circuits have been tested using methods including directly accessing circuitry and/or using devices within the integrated circuit to access circuitry. These testing methods are used for designing new devices as well as for debugging manufacturing processes for existing designs. Test results obtained using these testing methods are used for identifying defects in a circuit design or in a circuit manufacturing process, which in turn is used for modifying the design and/or manufacturing process. The modified designs are used for new prototypes, which are in turn tested and re-designed as needed.

Directly accessing circuitry for device testing and analysis is difficult for several reasons. For instance, in high-density circuit applications, it is difficult to accurately navigate stimulus sources to particular circuit nodes. In addition, it is sometimes necessary to destroy a portion of the die in order to access circuit nodes, such as when accessing circuitry in a conventional die via a die passivation layer. In flip chip type N dies, transistors and other circuitry are located in a very thin epitaxially grown silicon layer in a circuit side of the die, which is arranged face-down on a package substrate. Transistors and other circuitry near the circuit side are not readily accessible for testing, modification, or other purposes due to this face-down orientation. Therefore, access to the transistors and circuitry near the circuit side is from the back side of the die.

Another particular type of semiconductor device structure that presents unique challenges to circuit analysis is silicon-on-insulator (SOI) structure, wherein circuitry is located in a thin layer of silicon formed on an insulator, such as oxide. SOI structure exhibits benefits including reduced switch capacitance that leads to faster operation. However, direct access to circuitry for analysis of SOI structure involves milling through the insulator, which can damage circuitry or other structure in the device. Such damage can alter the characteristics of the device and render analysis of the device inaccurate. In addition, the milling process can be time-consuming, difficult to control and expensive.

The difficulty, cost, and destructive aspects of existing methods for testing integrated circuits are impediments to the growth and improvement of semiconductor technologies, including those involving flip-chip structures, conventional structures and SOI structures.

SUMMARY OF THE INVENTION

The present invention is directed to analyzing a semiconductor die in a manner that overcomes the impediments discussed above. The present invention is exemplified in a number of implementations and applications, some of which are summarized below.

According to an example embodiment of the present invention, a semiconductor die having circuitry in a circuit side opposite a back side is analyzed using an externally-applied electric field. The electric field is applied to the die using a source, separate from the die, and the electric field stimulates circuitry in the die. A response of die to the applied electric field is detected and used to detect an electrical characteristic of the die. For example, an open gate can be detected and identified or verified using the applied electric field as a second gate to bias a channel region below the open gate. In addition, a variety of other circuit characteristics, such as a gate having an oxide short or an interconnect having a short or open circuit, can also be detected. In each of these implementations, the circuit analysis can be carried out without necessarily removing any substrate from the die and is useful, for example, in analyzing prototype die designs for modification and implementation to large scale production.

In another example embodiment of the present invention, the electric field is applied using a source that includes a probe tip arrangement. The probe tip arrangement is configured and arranged for applying the electric field to the die in a variety of manners, depending upon the application. In one instance, the probe tip is navigated to a position over a selected circuit portion of the die using nanometer-scale resolution. Such precise navigation is useful, for example, in analyzing high-density circuits where it is desirable to direct the electric field to a particular circuit node. In another instance, the probe tip is scanned across the die in a manner that is particularly useful for stimulating a plurality of circuit nodes and identifying a particular response from one of the plurality of circuit nodes. In still another instance, the probe tip is used to apply an electric field that varies over time.

According to another example embodiment of the present invention, a system is adapted for analyzing a semiconductor die having circuitry in a circuit side opposite a back side. The system includes a probe tip arrangement, separate from the die and configured and arranged for applying an electric field to the die. The electric field is adapted for stimulating circuitry in the die, and electrical detection circuitry, such as a circuit testing arrangement, is adapted for detecting a response of die to the stimulation. A computer arrangement is adapted for using the response to detect an electrical characteristic of the die.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
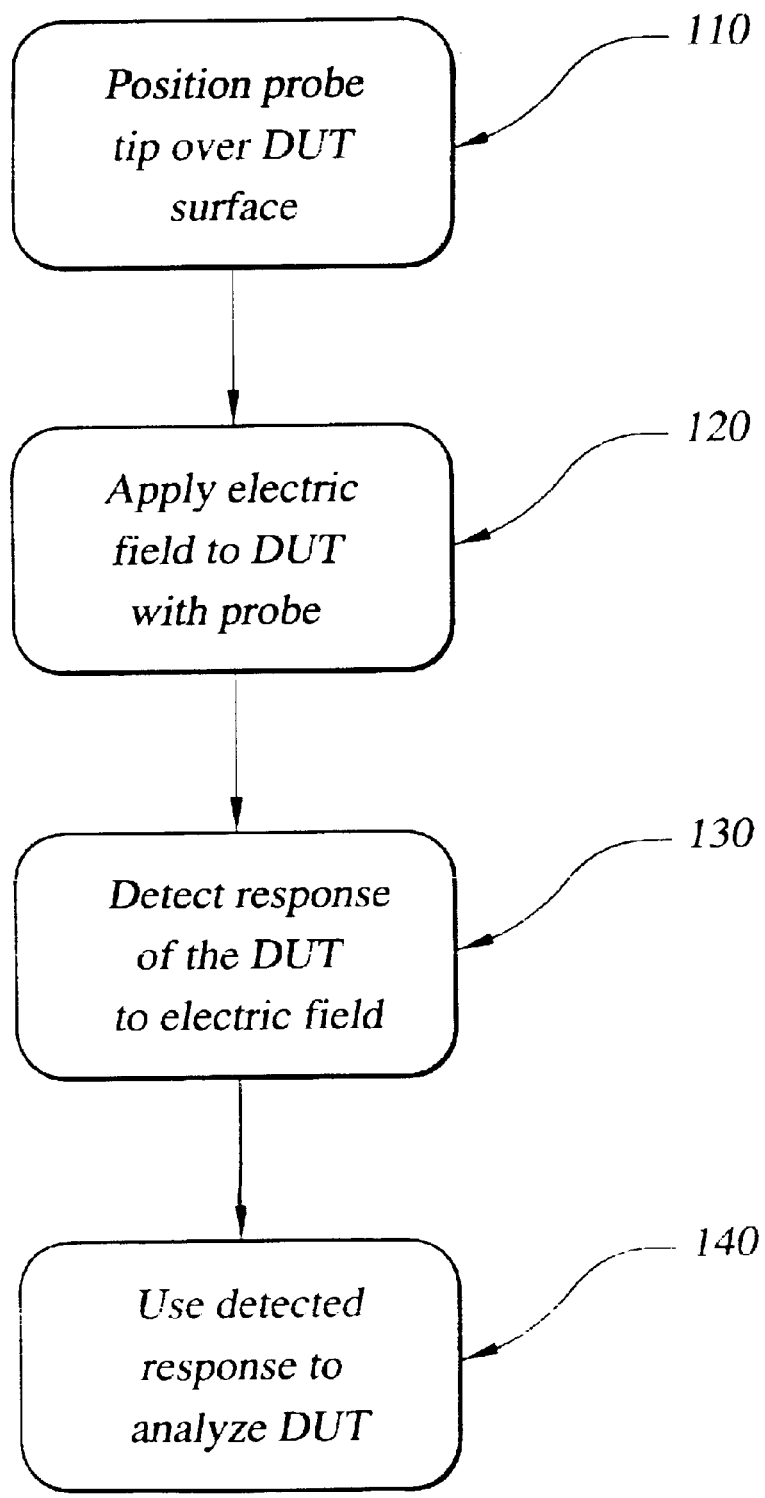
FIG. 1 is a flow diagram for semiconductor die analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for devices benefiting from analysis without necessarily directly contacting circuitry in the device. While the present invention is not necessarily limited to such devices, various aspects of the invention may be appreciated through a discussion of exemplary implementations using this context.

According to an example embodiment of the present invention, a semiconductor die is analyzed using an externally applied electric field to stimulate circuitry in the die. Devices that can be analyzed using the electric field include, for example, a CMOS device, BiCMOS device, bipolar integrated circuit, packaged substrate or unpopulated MCM board. The electric field is directed at one or more circuit portions in the die, such as by directing the electric field to a specific circuit node or by scanning the die with the electric field. The electric field stimulates the die and a response of the die to the stimulation is detected. The detected response is used to identify a condition of the circuitry, such as to verify proper operation of the circuitry or to identify a defect, such as an open gate or a gate oxide short.

In a more particular example embodiment of the present invention, the circuit condition detected in the example embodiment discussed above is used for modifying the design of the die. This modification may, for example, reduce or eliminate a defect or defects related to the detected circuit condition. The modified design is then used to manufacture one or more additional dies, which in turn can be similarly analyzed. Once the design is deemed sufficient for large-scale manufacturing, dies are then manufactured for implementation in a variety of applications.

In another more particular example embodiment of the present invention, the circuit condition detected in the example embodiment discussed above is used to identify a defective die manufacturing process. For example, the detection of a particular circuit characteristic in the analyzed die that exceeds a selected threshold may indicate that a particular operating parameter in the manufacturing process is unacceptable. Once the defective process is identified, it is modified to reduce or eliminate the defect.

FIG. 1 is a flow diagram showing a device under test (DUT) being analyzed, according to a more particular example embodiment of the present invention. At block 110, a conductive probe tip (e.g., Tungsten or metal-coated Si-Nitride) is positioned over a surface of the DUT using, for example, a circuit layout to navigate to a portion of circuitry therein. In one implementation, the probe is positioned using nanoscale resolution (e.g., positioning the probe within a few nanometers of the selected portion of circuitry). This approach is particularly useful in applications where stimulation is to be limited to a particular area of the die, which is accomplished using a sufficiently small probe tip. The probe tip may, for example, include a probe tip such as those used in a scanning probe microscopy (SPM), electric field microscopy, capacitance probe microscopy and atomic force microscopy (AFM). In one implementation, the needle tip is finely etched, such that the tip radius is less than about 50 nanometers in width, which improves the resolution of the positioning of the probe. The less than 50-nanometer width is sufficiently small such that the electric field can be precisely applied to stimulate a single circuit node or a few selected circuit nodes without necessarily stimulating circuitry adjacent to the node or nodes.

The DUT is operated and a voltage is applied to the probe tip to generate a corresponding electric field, which is applied to the DUT at block 120. The DUT operation may include, for example, operating the DUT under known failure conditions. In one implementation, the voltage applied to the tip is selected to be relative to a voltage at which circuitry in the DUT operates, such as a wordline for a memory cell. This is useful, for example, to bias a channel region of a transistor with the electric field for switching the transistor between blocking and conducting states. Defective transistor gates can be detected and identified as a result of the electric field switching the transistor under conditions that would otherwise cause the transistor to switch, absent the defect in the gate. In another implementation, the voltage applied to the tip includes a periodic voltage that is relative to a reference voltage in or external to the die, such as a power plane. The DUT is monitored and a response of the DUT to the electric field is detected at block 130. The detected response is used to analyze the DUT at block 140 to detect a condition of circuitry therein, including confirmation of proper operation and/or the detection of a defect, such as a short circuit, open circuit and/or a non-functioning transistor.

In another more particular example embodiment of the present invention, the positioning of the probe in block 110 and the application of the electric field in block 120 includes scanning the probe over the DUT and applying the electric field while the DUT is scanned. The response of the DUT is detected during the scan, and as such may include a varied response (e.g., as circuit portions are stimulated and the stimulation is subsequently removed, those circuit portions may undergo a state change, such as when stimulating a transistor as discussed above). In this implementation, the detected response is mapped to the location of the probe and used to identify a circuit portion of the DUT that responds to the stimulation. This is particularly useful in applications where the location of a defective circuit is unknown. In addition, the mapping can also be carried out in three dimensions, such that the circuit location of a DUT having multiple layers can be identified, e.g. by varying the distance between the tip and the suspect circuit or by changing the voltage on the tip.

In another example embodiment of the present invention, a defective circuit portion is identified during the analysis of the die at block 140, and the defective circuit portion is subsequently repaired. For example, when a transistor gate is malfunctioning, the application of an electric field to a channel region between source/drain regions can turn on the transistor. When a non-functioning transistor is turned on with the electric field, the location of the probe when the transistor is turned on is used to identify the location of the non-functioning transistor. A new gate is formed at the defective location (e.g., on an exposed insulator portion of a SOI die), and is electrically coupled for operating the transistor. In one implementation, a focused ion beam (FIB) is used to form the new gate by depositing a metal film over the insulator. The new gate can either be electrically coupled to circuitry in the die (e.g., to the wordline that the non-functioning gate was connected to), or to other test circuitry that is separate from the die. In another implementation, after the operation of the transistor has been restored using the new gate, the probe is used to further scan the die to detect an electrical characteristic of other circuitry in the die (e.g., for tracing circuit logic downstream from the non-functioning transistor).

As discussed above, the electric field stimulation is applicable to many different devices, such as conventionally packaged dies, flip-chip packaged dies and dies having silicon-on-insulator (SOI) structure. If necessary, a packaged die being analyzed is prepared for the type of analysis to be performed. In one instance, a portion of a packaged die is removed to expose a region in the die via which the electric field is applied. For conventionally packaged dies, this involves applying the electric field via a portion of a chip passivation layer where some of the passivation layer has been removed. For flip-chip packaged dies, a portion of a backside that is opposite a circuit side (arranged face-down on a package substrate) is removed, and the electric field is applied via the removed portion of the backside. For general information regarding implementations to which the present invention is applicable, and for specific information regarding the removal of substrate for preparing a die for analysis in connection with the present invention, reference may be made to U.S. patent application Ser. No. 09/997,715, now U.S. Pat. No. 6,635,572, filed Nov. 28, 2001 and entitled "Method of Substrate Silicon Removal for Integrated Circuit Devices," which is fully incorporated by reference.

Figure 2:
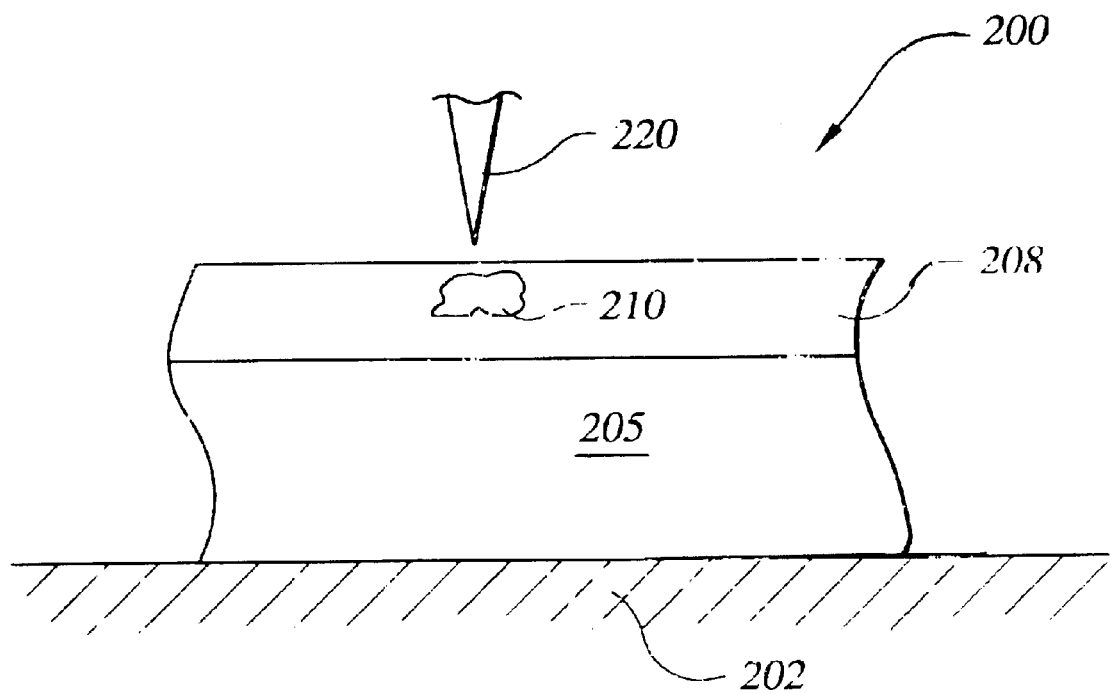
FIG. 2 is a conventionally packaged semiconductor die undergoing analysis, according to another example embodiment of the present invention.

As discussed above, the present invention is applicable to a variety of analysis techniques and to a variety of types of semiconductor dies. FIG. 2 shows one such semiconductor die 200 conventionally packaged to a substrate 202 and undergoing analysis with a scanning probe microscope (SPM) tip 220 (only a portion of which is shown for clarity), according to another example embodiment of the present invention. The die 200 includes a circuit portion 210 located in a die passivation layer 208 of a circuit side of the die. The die is operated and the SPM tip 220 is moved into position over the circuit portion 210 using a circuit diagram of the die for reference. The SPM tip is finely etched to a point having a diameter of less than about 50 nanometers. As the SPM tip is scanned across the circuit portion 210, a change in an electrical characteristic of the die is detected. The electrical characteristic change is used to detect a condition of circuitry in the die, such as a defective circuit.

Figure 3:
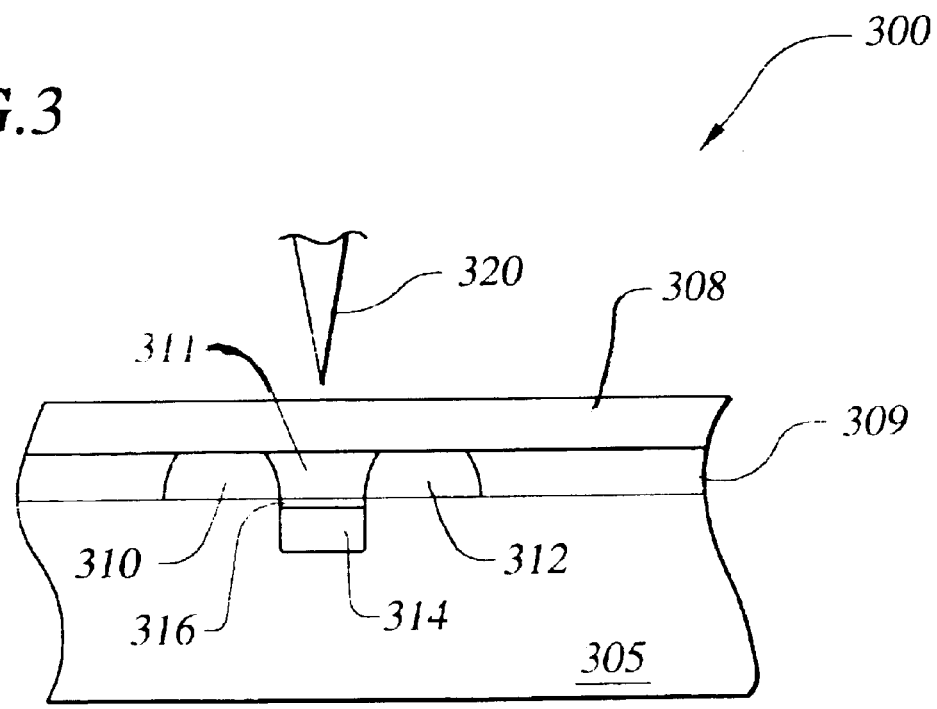
FIG. 3 is a semiconductor die having silicon-on-insulator structure undergoing analysis, according to another example embodiment of the present invention.

FIG. 3 shows a semiconductor die 300 having SOI structure and a defective transistor gate undergoing analysis, according to another example embodiment of the present invention. The die 300 includes a transistor located in a circuit side opposite a back side of the die and having source/drain regions 310 and 312 separated by a channel region 311, with the channel region 311 being separated from a gate 314 by a gate dielectric material 316. The source/drain regions are located in a silicon layer 309 immediately adjacent to an insulator layer 308. The die is thinned to expose the insulator layer 308, and the die is operated under conditions known to cause a circuit failure in the die. A SPM having a tip portion 320 is scanned over the insulator 308 and over the channel region 311. As the SPM is scanned across the channel region, it acts as a second gate and turns the transistor on, biasing the channel region 311 and closing a circuit between the source/drain regions 310 and 312. An electrical response to the transistor being turned on is detected and used to identify the location of the defective transistor as being below the position of the probe point 320.

Figure 4:
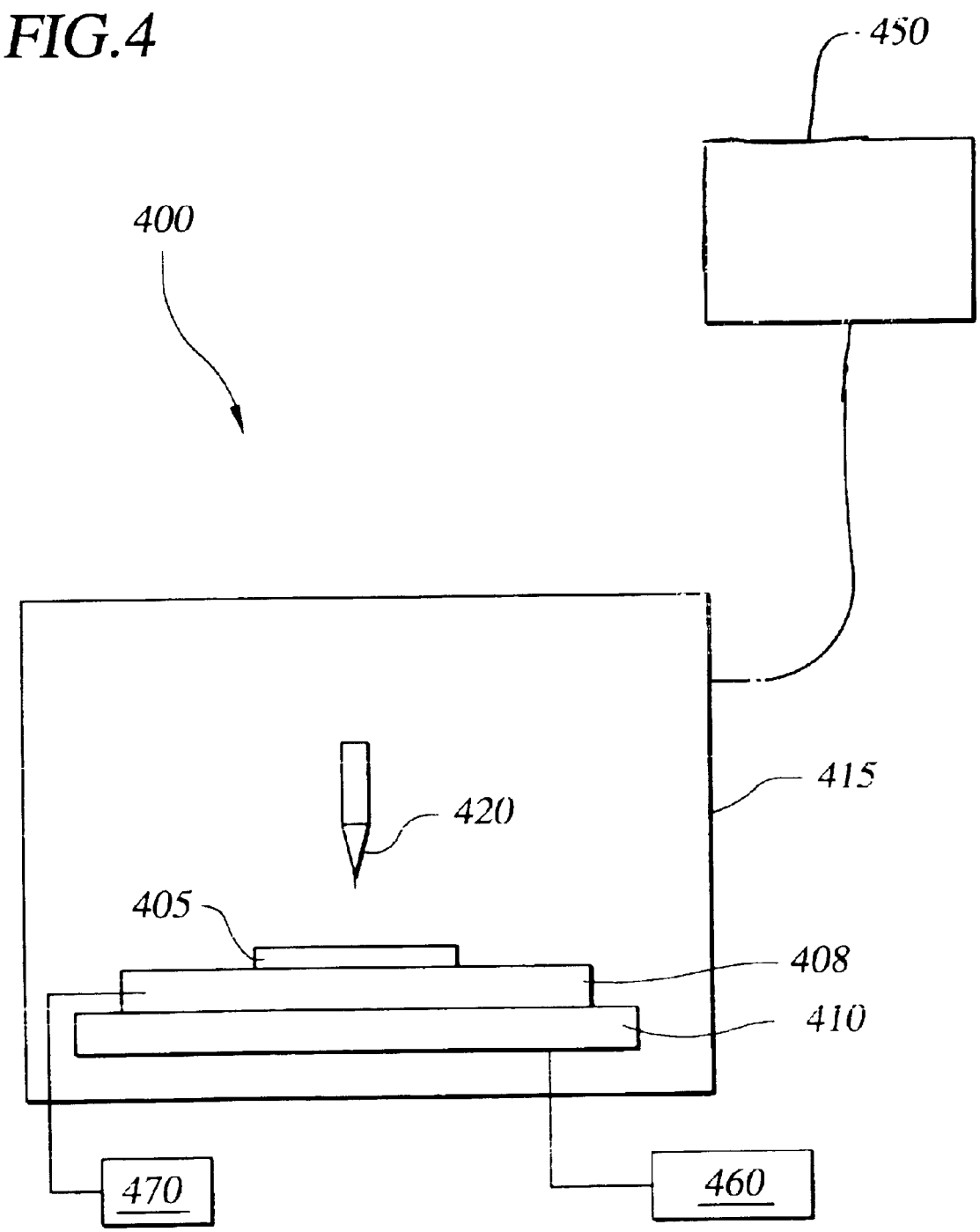
FIG. 4 is a system for analyzing a semiconductor die, according to another example embodiment of the present invention.

FIG. 4 is a system 400 adapted to analyze a semiconductor die, such as those discussed in connection with FIGS. 2 and 3, according to another example embodiment of the present invention. The system includes a probing arrangement 415 having an X-4 stage 410 adapted to hold a semiconductor die 405 in a DUT board 408. A power supply 460 is used to operate the die 405 under selected conditions, such as normal die operating conditions. The probing arrangement 415 is controlled by a controller 450 that is adapted to effect a scan of the die 405 with a probe tip 420 for detecting an electrical characteristic therein. The position of the probe tip during the scan is controlled in one of either a spot mode or a scanning mode. In the spot mode, the tip is moved to a particular position over circuitry in the die 405. In the scanning mode, the tip is scanned across the die. This can be accomplished, for example, using an x-y positioning arrangement (not shown), such as those commonly used in SPM (scanning probe microscope) applications. The tip can be controllably moved vertically using a Piezo-Z stage and can also be configured so that the tip-to-sample distance can be maintained at a specific distance during the scan. A testing arrangement 470 is electrically coupled to the die 405 and used to detect a response of the die to the electric field. Example SPM arrangements that can be adapted for implementation in connection with the present invention include those available from Digital Instruments, Veeco Metrology Group, 112 Robinhill Rd., Santa Barbara, Calif.

The controller 450 is adapted to operate the probing arrangement in a variety of manners, such as those described hereinabove and including a varying voltage mode, where a voltage signal to the probe tip 420 is varied over time in a manner that causes a response in circuitry in the die 405. The controller 450 is also optionally adapted and communicatively coupled to provide a control signal to the power supply 460. The control signal is selected to effect a desired operation of the die, such as to cause the die to operate in a known failure condition or to undergo a state-changing operation. In addition, the controller 450 is further optionally coupled to the testing arrangement 470 and used to record the response of the die 405 and to correlate the response to the position of the probe tip 420, such as for mapping the location of the probe tip to a particular response.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having circuitry in a circuit side opposite a back side, the method comprising:
applying an electric field to the die via a voltage-application tool, separate from the die and using the applied electric field to stimulate circuitry in the die including applying an electric field to circuitry via a die passivation layer in a conventionally packaged semiconductor die;
detecting a response of the die to the applied electric field; and
using the response to detect an electrical characteristic from the die.

2. A method for analyzing a semiconductor die having circuitry in a circuit side opposite a back side, the method comprising:
applying an electric field to the die via a voltage-application tool, separate from the die and using the applied electric field to stimulate circuitry in the die including applying an electric field to circuitry via a backside of a flip-chip packaged die;
detecting a response of the die to the applied electric field; and
using the response to detect an electrical characteristic from the die.

3. The method of claim 2, wherein applying an electric field to circuitry via a backside of a flip-chip packaged die includes applying an electric field via a thinned backside of the flip-chip packaged die.

4. The method of claim 3, further comprising thinning the backside of the flip-chip packaged die and thereby forming the thinned backside.

5. A method for analyzing a semiconductor die having circuitry in a circuit side opposite a back side, the method comprising:
applying an electric field to the die via a voltage-application tool, separate from the die and using the applied electric field to stimulate circuitry in the die including applying an electric field to circuitry via an insulator portion of silicon-on-insulator structure in a die;
detecting a response of the die to the applied electric field; and
using the response to detect an electrical characteristic from the die.

6. The method of claim 5, further comprising thinning a portion of the die and exposing the insulator portion of the silicon-on-insulator structure, wherein applying an electric field to circuitry via the insulator portion includes applying the electric field via the exposed insulator portion.

7. A method for analyzing a semiconductor die having circuitry in a circuit side opposite a back side, the method comprising:
applying an electric field to the die via a voltage-application tool, separate from the die and using the applied electric field to stimulate circuitry in the die using at least one of: a scanning probe microscope, an atomic force microscope and a capacitance probe microscope;
detecting a response of the die to the applied electric field; and
using the response to detect an electrical characteristic from the die.

8. A method for analyzing a semiconductor die having circuitry in a circuit side opposite a back side, the method comprising:
applying an electric field to the die via a voltage-application tool, separate from the die and using the applied electric field to stimulate circuitry in the die including positioning a probe tip over a portion of circuitry in the die and applying a voltage to the probe tip;
detecting a response of the die to the applied electric field; and
using the response to detect an electrical characteristic from the die.

9. The method of claim 8, wherein applying a voltage to the probe tip includes applying a voltage that varies over time to the probe tip.

10. The method of claim 8, wherein detecting a response of the die to the applied electric field includes detecting a position of the probe tip over the die and mapping the detected response to circuitry in the die below the probe tip.

11. The method of claim 8, wherein positioning the probe tip includes scanning the probe tip over the die.

12. The method of claim 11, wherein detecting a response of the die includes detecting responses from a plurality of circuits in the die as the probe tip is scanned over the circuits.

13. The method of claim 8, wherein applying a voltage to the probe tip includes applying a periodic voltage that is relative to a voltage at a reference node in the die.

14. The method of claim 8, wherein positioning a probe tip includes positioning a probe tip having a radius that is sufficiently small to stimulate a selected node in the die without stimulating circuitry adjacent to the selected node.

15. The method of claim 8, wherein positioning a tip over a portion of circuitry in the die includes positioning the tip using nanometer-level resolution.

16. A method for analyzing a semiconductor die having circuitry in a circuit side opposite a back side, the method comprising:
applying an electric field to the die via a voltage-application tool, separate from the die and using the applied electric field to stimulate circuitry in the die including applying the electric field to circuitry via an opaque layer in the die, the circuitry being buried in the die below the opaque layer;
detecting a response of the die to the applied electric field; and
using the response to detect an electrical characteristic from the die.

17. A method for analyzing a semiconductor die having circuitry in a circuit side opposite a back side, the method comprising:
applying an electric field to the die via a voltage-application tool, separate from the die and using the applied electric field to stimulate circuitry in the die;
detecting a response of the die to the applied electric field;
using the response to detect an electrical characteristic from the die; and
using the detected electrical characteristic to provide a modified die design and manufacturing a semiconductor device using the modified die design.

18. A semiconductor device manufactured using the modified die design of claim 17.

19. A system for analyzing a semiconductor die having circuitry in a circuit side opposite a back side, the system comprising:
means, separate from the die and adapted for applying an electric field to the die and using the applied electric field to stimulate circuitry in the die;
means for detecting a response of die to the applied electric field; and
means for using the response to detect an electrical characteristic of the die.

20. A system for analyzing a semiconductor die having circuitry in a circuit side opposite a back side, the system comprising:

a probe tip arrangement, separate from the die and adapted for applying an electric field to the die for stimulating circuitry in the die;

electrical detection circuitry adapted for detecting a response of die to the applied electric field; and a computer arrangement adapted for using the response to detect an electrical characteristics of the die.

21. The system of claim 20; wherein the probe tip is sufficiently small to apply an electric field to stimulate a selected circuit node in the die without stimulating surrounding circuitry in the die.

* * * * *

UNITED STATES PATENT AND TRADEMARK OFFICE
CERTIFICATE OF CORRECTION

PATENT NO. : 6,891,390 B1
DATED : May 10, 2005
INVENTOR(S) : Goruganthu et al.

It is certified that error appears in the above-identified patent and that said Letters Patent is hereby corrected as shown below:

Column 2,
Lines 10 and 15, "dic" should read -- die --.

Signed and Sealed this

Twenty-seventh Day of September, 2005

JON W. DUDAS
*Director of the United States Patent and Trademark Office*